US011276712B2

United States Patent
Luo et al.

(10) Patent No.: US 11,276,712 B2
(45) Date of Patent: Mar. 15, 2022

(54) ARRAY SUBSTRATE, METHOD OF FABRICATING ARRAY SUBSTRATE, DISPLAY DEVICE, AND METHOD OF FABRICATING DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Peng Luo, Beijing (CN); Xinchao Cui, Beijing (CN); Delong Zhong, Beijing (CN); Zhiqiang Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 616 days.

(21) Appl. No.: 16/315,311

(22) PCT Filed: Jun. 13, 2018

(86) PCT No.: PCT/CN2018/091025
§ 371 (c)(1),
(2) Date: Jan. 4, 2019

(87) PCT Pub. No.: WO2019/076071
PCT Pub. Date: Apr. 25, 2019

(65) Prior Publication Data
US 2021/0327903 A1 Oct. 21, 2021

(30) Foreign Application Priority Data
Oct. 19, 2017 (CN) .......................... 201710979875.4

(51) Int. Cl.
*H01L 27/12* (2006.01)
*H01L 29/786* (2006.01)
(Continued)

(52) U.S. Cl.
CPC ...... *H01L 27/124* (2013.01); *H01L 29/78633* (2013.01); *G09G 3/3225* (2013.01); *G09G 3/3266* (2013.01); *G09G 2300/0809* (2013.01)

(58) Field of Classification Search
CPC ............... G09G 3/3225; G09G 3/3266; G09G 2300/0809; H01L 27/124; H01L 29/78633;
(Continued)

(56) References Cited

U.S. PATENT DOCUMENTS 10,152,939 B2    12/2018   Liu
2007/0164954 A1* 7/2007   Yang .................... G09G 3/3677
                                                        345/88
(Continued)

FOREIGN PATENT DOCUMENTS

CN     103700354 A    4/2014
CN     104409037 A    3/2015
(Continued)

OTHER PUBLICATIONS

Office Action dated Nov. 5, 2019 issued in counterpart Chinese Application No. 201710979875.4 (w/ English machine translation; 15 pages).
(Continued)

*Primary Examiner* — Joe H Cheng
(74) *Attorney, Agent, or Firm* — Westerman, Hattori, Daniels and Adrian, LLP

(57) ABSTRACT

A display panel has a display area; and a peripheral area surrounding the display area, the peripheral area comprising a first area, a second area, a third area opposite to the first
(Continued)

area, and a fourth area opposite to the second area. The display panel may further include a data driving integrated circuit provided in the first area; a gate drive circuit provided in the third area; and a plurality of signal transmission lines arranged in at least one of the second area and the fourth area. The configuration of the data driving integrated circuit and the gate drive circuit makes it possible to manufacture a display panel with a narrow bezel.

11 Claims, 8 Drawing Sheets

(51) Int. Cl.
  *G09G 3/3225* (2016.01)
  *G09G 3/3266* (2016.01)
(58) Field of Classification Search
  CPC ............ G02F 1/1345; G02F 1/136209; G02F 1/136286
  See application file for complete search history.

(56) References Cited

U.S. PATENT DOCUMENTS

| | | | |
|---|---|---|---|
| 2007/0200993 | A1 | 8/2007 | Aramatsu |
| 2008/0284969 | A1* | 11/2008 | Lim ................... G02F 1/13458 349/152 |
| 2014/0111557 | A1* | 4/2014 | Omata ................. G09G 3/3233 345/690 |
| 2016/0260404 | A1 | 9/2016 | Liu |
| 2018/0061907 | A1* | 3/2018 | Kim ..................... H01L 27/3213 |
| 2018/0090398 | A1* | 3/2018 | Park ................... G02F 1/136286 |
| 2018/0174517 | A1* | 6/2018 | Lee ....................... G09G 3/3233 |
| 2018/0286938 | A1* | 10/2018 | Moon ................. H01L 27/1218 |
| 2018/0364845 | A1* | 12/2018 | Lee ....................... H01L 27/124 |
| 2019/0115415 | A1* | 4/2019 | Choi ................... H01L 51/5203 |

FOREIGN PATENT DOCUMENTS

| | | |
|---|---|---|
| CN | 104658505 A | 5/2015 |
| CN | 105206232 A | 12/2015 |
| CN | 106292103 A | 1/2017 |
| CN | 107632474 A | 1/2018 |
| JP | H08-334740 A | 12/1996 |
| WO | 2019076071 A1 | 4/2019 |

OTHER PUBLICATIONS

Office Action dated Apr. 3, 2020, issued in counterpart Chinese Application No. 201710979875.4 (w/ English machine translation; 13 pages).
International Search Report and Written Opinion dated Aug. 31, 2018 issued in counterpart International Application No. PCT/CN2018/091025 (in English; 11 pages).

* cited by examiner

ARRAY SUBSTRATE, METHOD OF FABRICATING ARRAY SUBSTRATE, DISPLAY DEVICE, AND METHOD OF FABRICATING DISPLAY DEVICE

CROSS-REFERENCE TO RELATED APPLICATIONS

This application is the U.S. National Stage of International Application No. PCT/CN2018/091025, filed on Jun. 13, 2018, which claims priority under 35 U.S.C. § 119 of the filing date of Chinese Patent Application No. 201710979875.4 filed on Oct. 19, 2017, the entire disclosure of each of the foregoing is hereby incorporated by reference.

TECHNICAL FIELD

The present disclosure generally relates to the field of display technology, and in particular, to a display panel and a display device.

BACKGROUND

A current trend in the field of display technology is a "narrow bezel" or even a "bezel-less" display. A conventional display device (for example, an organic light emitting diode (OLED) display device) may comprise an array substrate that comprises a display region and a periphery region surrounding the display region. The display region is provided with a plurality of pixel structures, whereas the periphery region is provided with a plurality of lines for loading drive signals to individual pixel structures. The width of the periphery region constitutes the "bezel." In order to reduce the width of the bezel, the "gate on array" (GOA) technology has been proposed, where a gate drive circuit is formed in the periphery region of the array substrate.

BRIEF SUMMARY

One embodiment of the present disclosure is a display panel. The display panel may comprise a display area; and a peripheral area surrounding the display area, the peripheral area comprising a first area, a second area, a third area opposite to the first area, and a fourth area opposite to the second area. The display panel may further comprise a data driving integrated circuit provided in the first area, a gate drive circuit provided in the third area, and a plurality of signal transmission lines arranged in at least one of the second area and the fourth area. The plurality of signal transmission lines may extend in a first direction, and may be electrically connected to the gate drive circuit and configured to provide time sequence signals to the gate drive circuit.

In at least some embodiments, the display panel may further comprise a plurality of gate connecting lines arranged in the display area and extending in the first direction, and a plurality of gate lines arranged in the display area and extending in a second direction. The first direction and the second direction may be substantially perpendicular to each other.

In at least some embodiments, the display panel may further comprise a substrate, a light shielding layer provided on one side of the substrate, a buffer layer provided on a side of the light shielding layer opposite from the substrate, a gate insulating layer provided on a side of the buffer layer opposite from the substrate, and at least one through-hole extending through the buffer layer and the gate insulating layer. The plurality of signal transmission lines may be provided in a same layer as the light shielding layer. A plurality of gate lines may be provided on a side of the gate insulating layer opposite from the substrate. The plurality of gate lines may be electrically connected to the plurality of signal transmission lines through the at least one through-hole.

In at least some embodiments, the display panel may further comprise a plurality of switches, the number of switches satisfying the relationship N×S, with N being a number of output terminals in the gate drive circuit, S being a number of gate connecting lines connected to one of the plurality of output terminals, and N and S each being a positive integer equal to or greater than 1. In at least some embodiments, each of the plurality of switches may comprise a first end and a second end. The first end of each of the plurality of switches may be electrically connected to at least one of the plurality of gate connecting lines. The second end of each of the plurality of switches may be electrically connected to an output terminal of the gate drive circuit that is connected to the at least one of the plurality of gate connecting lines.

In at least some embodiments, the display panel may comprise an array of pixels. The display panel may comprise a same number of gate connecting lines as a number of rows in the array of pixels. Each of the gate connecting lines may be electrically connected to one of the rows in the array of pixels.

In at least some embodiments, each of the plurality of switches may comprise a plurality of transistors. The display panel may further comprise a reset unit configured to perform a reset operation to at least one of (i) a gate connecting line connected to a (n+1)-th switch when a n-th switch is turned on and (ii) a gate connecting line connected to a (N×S)-th switch when a first of the plurality of transistors in a switch is turned on, with n being a value that is smaller than a positive integer of (N×S).

In at least some embodiments, the reset unit may comprise a plurality of transistors, the number of transistors in the reset unit being the same as the number of switches in the display panel.

In at least some embodiments, each of the plurality of transistors of the reset unit may comprise a gate electrode, a source electrode, and a drain electrode. The gate electrode of an n-th transistor in the reset unit may be electrically connected to a first end of the corresponding n-th switch. The source electrode of the n-th transistor in the reset unit may be electrically connected to a predetermined voltage signal. The drain electrode of the n-th transistor may be electrically connected to a first end of the (n+1)-th switch.

In at least some embodiments, the drain electrode of the first transistor in the reset unit may be electrically connected to a first end of the (N×S)-th transistor.

Another embodiment of the present disclosure is a display device. The display device may comprise a display panel as described above.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
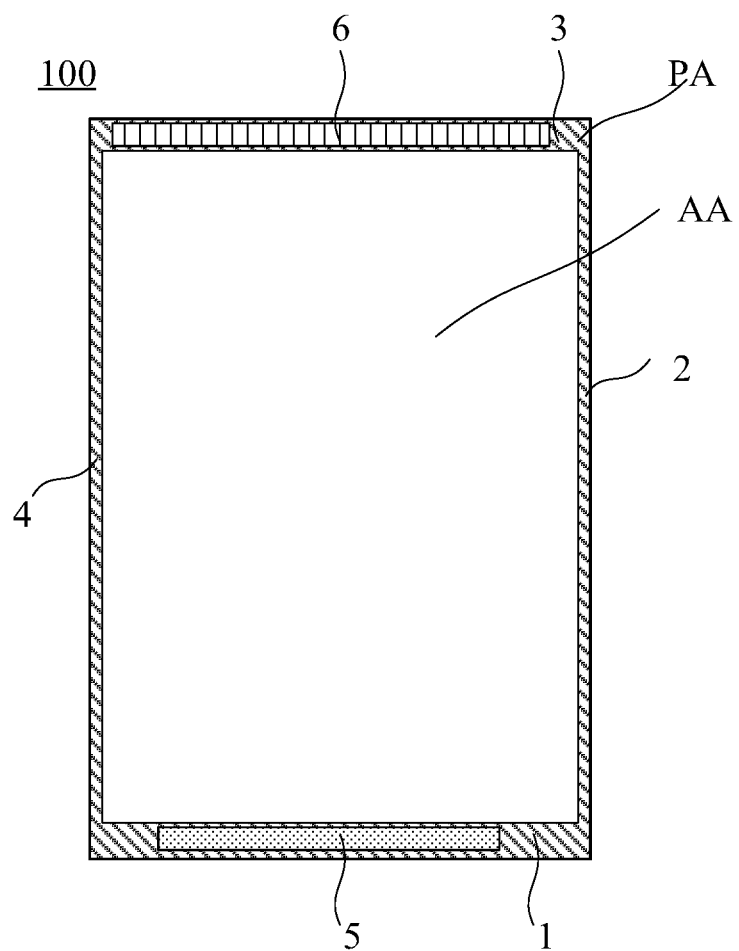
FIG. 1 shows a schematic diagram of a display panel according to an embodiment of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function as the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

A current trend in the field of display technology is a "narrow bezel" or even a "bezel-less" display. A conventional display device (for example, an organic light emitting diode (OLED) display device) may comprise an array substrate that comprises a display region and a periphery region surrounding the display region. The display region is provided with a plurality of pixel structures, whereas the periphery region is provided with a plurality of lines for loading drive signals to individual pixel structures. The width of the periphery region constitutes the "bezel." In order to reduce the width of the bezel, the "gate on array" (GOA) technology has been proposed, where a gate drive circuit is formed in the periphery region of the array substrate. However, conventional techniques for integrating the gate driving circuit onto the display panel make it difficult to reduce the amount of wiring in the display panel frame. The wirings still occupy a certain width, so as to limit the ability of conventional techniques to reduce the width of the display panel bezel. Therefore, there is a need to address the technical problem of further reducing the bezel width of a display panel.

Embodiments of the present disclosure arrange the data driving integrated circuit and the gate drive circuit on opposite sides of a display panel, so that the number of components (for example, the gate and data lines) that need to be installed in the remaining sides of the display panel can be reduced and the width of the bezel corresponding to those remaining sides of the display panel can be narrowed. This makes it possible to realize a display panel with a narrow bezel.

FIG. 1 shows a schematic diagram of a display panel according to an embodiment of the present disclosure. A display panel according to the present disclosure may be integrated into any display apparatus, including, but not limited to, a mobile phone, a tablet, a television, a computer, a display, a notebook computer, a digital photo frame, a navigation system, and any other products or components that provide a display function.

As shown in FIG. 1, a display panel 100 according to the present disclosure comprises a display area AA and a peripheral area PA surrounding the display area AA. The peripheral area PA includes a first area 1, a second area 2, a third area 3, and a fourth area 4. A data driving integrated circuit 5 is provided in one area of the peripheral area (for example, the first area 1 in the embodiment illustrated in FIG. 1) of the display panel. A gate drive circuit 6 is provided in an area of the peripheral area that is opposite from the data driving integrated circuit 5 (for example, the third area 3 in the embodiment illustrated in FIG. 1).

The gate drive circuit 6 may be manufactured according to any suitable process known to a person of ordinary skill in the art, including the gate of array (GOA) technique.

A plurality of signal transmission lines (22 in FIG. 5) are arranged in at least one of the remaining areas of the periphery area of the display panel (for example, in at least one of the second area 2 and the fourth area 4 in the embodiment illustrated in FIG. 1). The signal transmission lines 22 are arranged in a direction parallel to the second area 2 and/or the fourth area 4 of the display panel. The signal transmission lines 22 are configured to electrically connect to the gate drive circuit 6, and to provide time sequence signals to the gate drive circuit 6. More particularly, each signal transmission line 22 comprises a first component configured to transmit time sequence signals to the gate drive circuit 6, and a second component configured to transmit signals to a switch.

It is understood that additional components and/or accessories may be provided within a display panel of the present disclosure without departing from the spirit and scope of the present disclosure. A person of ordinary skill in the art would readily appreciate that the configuration of a display panel is not limited to the embodiments shown in the figures, and a display panel may include any additional components that are typically found in a display panel and/or that are provided according to any particular purpose for which the display panel is intended. For example, in some embodiments, the display panel may further comprise a flexible circuit board electrically connected to the data driving integrated circuit 5; an electrostatic discharge unit; a fan-out unit provided between the data driving integrated circuit 5 and the first area 1; a cell test data line (CTD), and/or a data selector (MUX, Multiplexer). The display panel may also include a cell test VCOM signal line (CT VCOM) provided on a side of the source of the gate drive circuit 6 that is opposite from the third area 3, a touch metal wire electrostatic discharge unit (TX ESD unit), and/or a gate drive circuit electrostatic discharge unit (GOA ESD unit).

In a display panel according to the present disclosure, the data driving integrated circuit 5 and the gate drive circuit 6 are provided on opposite portions of the display panel (for example, on the first area 1 and the third area 3, respectively, in the embodiment illustrated in FIG. 1). This configuration of the data driving integrated circuit 5 and the gate drive circuit 6 makes it possible to reduce the need to install wiring and/or other components in the remaining two areas of the display panel (for example, the second area 2 and the fourth area 4 in the embodiment illustrated in FIG. 1), so as to effectively reduce the widths of those two areas of the display panel. This in turn makes it possible to significantly reduce the width of the bezel of the display panel.

Figure 2:
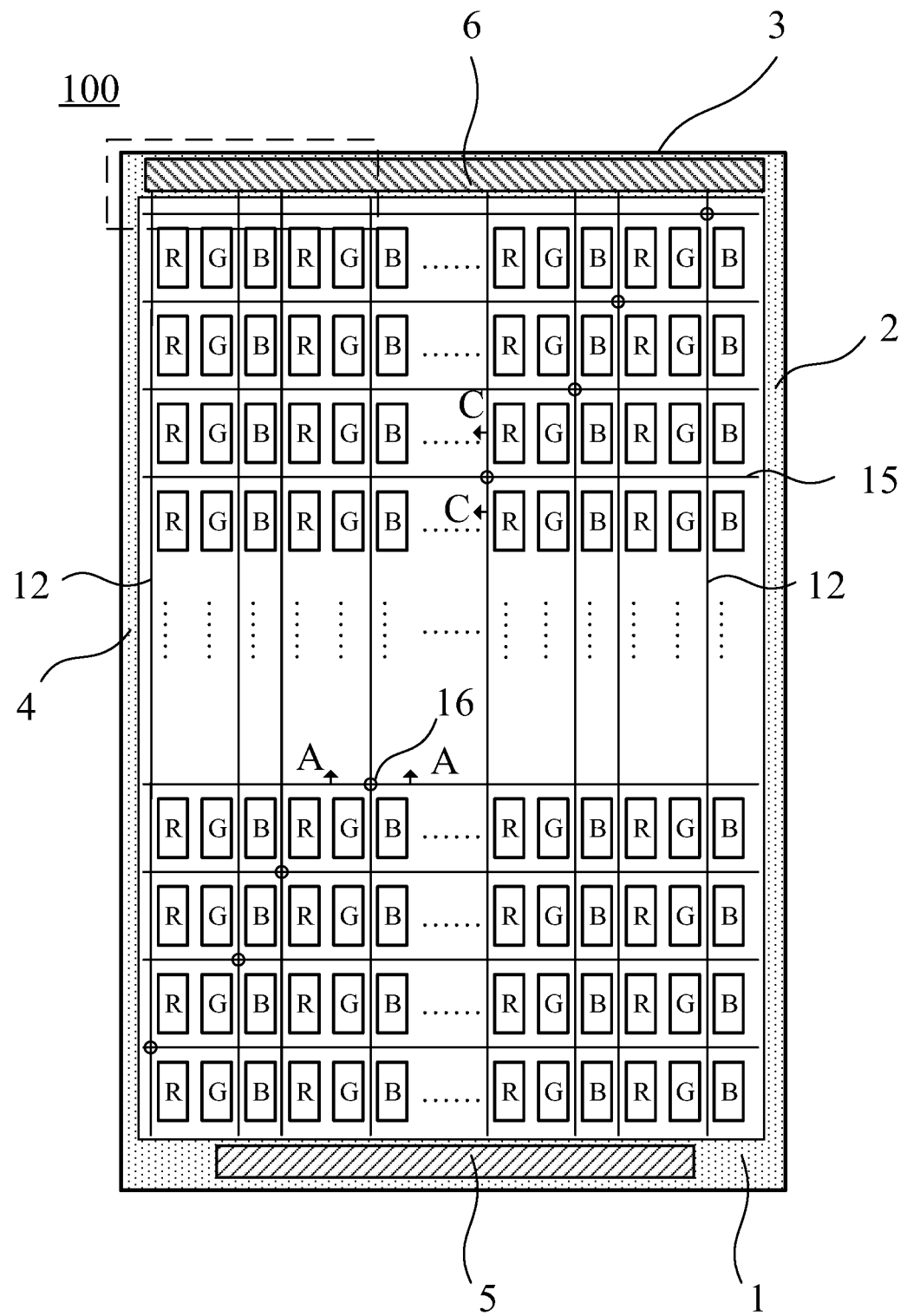
FIG. 2 shows a wiring diagram of a display panel according to an embodiment of the present disclosure.
Figure 3:
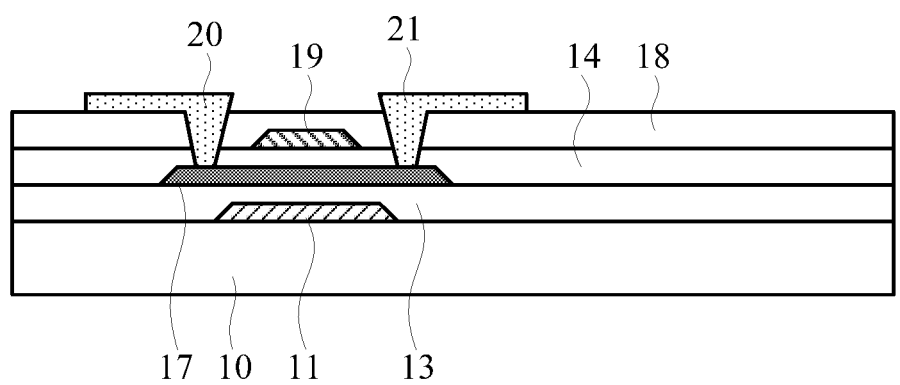
FIG. 3 shows a schematic cross-sectional view of the display panel illustrated in FIG. 2 along the line A-A.
Figure 4:
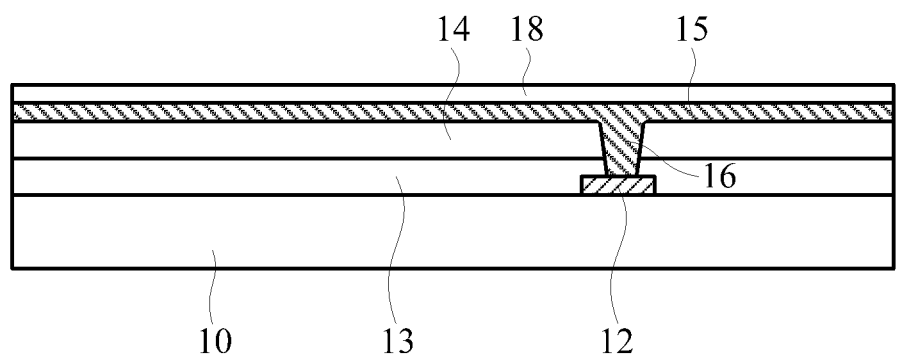
FIG. 4 shows a schematic cross-sectional view of the display panel illustrated in FIG. 2 along the line C-C.

FIG. 2 shows a wiring diagram of a display panel according to an embodiment of the present disclosure. FIG. 3 shows a schematic cross-sectional view of the display panel illustrated in FIG. 2 along the line A-A. FIG. 4 shows a schematic cross-sectional view of the display panel illustrated in FIG. 2 along the line C-C.

As shown in FIGS. 3 and 4, a display panel according to the present disclosure also includes a substrate 10, a light shielding layer 11 provided on one side of the substrate 10, and at least one gate connecting line 12 provided in the same layer as the light shielding layer 11. The gate connecting line 12 is configured to transmit gate driving signals from the gate drive circuit 6 to the gate line 15, so as to enable control of the transistor corresponding to each individual pixel in the display panel (for example, as shown in FIG. 2). In some embodiments, providing the gate connecting line 12 in the same layer as the light shielding layer 11 makes it possible for the gate drive circuit 6 to transmit gate driving signals to the gate line 15 through the gate connecting line 12, which drives the gate electrode and performs sequential scanning of each of the pixel rows in the display panel. In some embodiments, the gate connecting line 12 is arranged in a direction parallel to the signal transmission lines (22 in FIG. 5) provided in the periphery area of the display panel.

A buffer layer 13 may be provided on a side of the gate connecting line 12 opposite from the substrate 10. In some embodiments, the buffer layer 13 covers at least a portion of the gate connecting line 12 and at least a portion of the substrate 10. A gate insulating layer 14 may be provided on a side on the buffer layer 13 opposite from the substrate 10. At least one gate line 15 is provided on a side of the gate insulating layer 14 opposite from the substrate 10. At least one through-hole 16 extends through the gate insulating layer 14 and the buffer layer 13. The gate line 15 is electrically connected to the gate connecting line 12 via the through-hole 16. In some embodiments, the gate line 15 is arranged in a direction perpendicular to the signal transmission lines (22 in FIG. 5) provided in the periphery area of the display panel.

FIG. 3 shows a schematic cross-sectional view of the display panel illustrated in FIG. 2 along the line A-A. As shown in FIG. 3, the display panel may also include an active layer 17 provided on a side of the buffer layer 13 opposite from the substrate 10. A gate electrode 19 may be provided on a side of the gate insulating layer 14 opposite from the substrate 10. The gate electrode 19 may be configured to be electrically connected to the gate line 15. A passivation layer 18 may be provided on a side of the gate electrode 19 opposite from the substrate. A source electrode 20 and a drain electrode 21 may be provided on a side of the passivation layer 18 opposite from the substrate 10. At least one through-hole may be provided that extends through passivation layer 18 and at least a portion of the gate insulating layer 14. The source electrode 20 and the drain electrode 21 may be electrically connected to the active layer 17 via the through-hole in the passivation layer 18 and the gate insulating layer 14.

FIG. 4 shows a schematic cross-sectional view of the display panel illustrated in FIG. 2 along the line C-C. As shown in FIG. 4, the gate line 15 may be arranged in a direction that is parallel to the first area 1 and the third area 3 of the display panel illustrated in FIG. 2. The gate connecting line 12 may be arranged in a direction that is perpendicular to the gate line 15, and electrically connected to the gate line 15 via the through-hole 16. The gate connecting line 12 is configured to transmit gate driving signals from the gate drive circuit 6 to the gate line 15, so as to enable control of the transistor corresponding to each individual pixel in the display panel (for example, as shown in FIG. 2). In some embodiments, providing the gate connecting line 12 in the same layer as the light shielding layer 11 makes it possible for the gate drive circuit 6 to transmit gate driving signals to the gate line 15 through the gate connecting line 12, which drives the gate electrode and performs sequential scanning of each of the pixel rows in the display panel.

In some embodiments, the display panel may include an array having M rows and N columns of pixels, with M and N each being an integer greater than 1. M signal transmission lines 22 are provided for M rows of pixels, and each signal transmission line 22 is electrically connected to a corresponding gate line servicing one of the M rows of pixels. Electrically connecting each signal transmission line 22 with a corresponding gate line servicing one of the pixel rows makes it possible to transmit gate driving signal along one signal transmission line 22 to one gate line 15, so as to enable sequential scanning of each of the pixel rows in the display panel.

In some embodiments, for an array substrate containing N columns of pixels, the array may be subdivided into regions containing N columns and/or M rows of pixels, and a signal transmission line 22 is provided for each region. This configuration makes it possible to uniformly distribute the signal transmission lines 22 in the array substrate, so as to simplify the design and construction of the wiring process.

For example, FIG. 2 shows a wiring diagram of a display panel according to an embodiment of the present disclosure. As shown in FIG. 2, each pixel may be a red pixel (R), a green pixel (G), or a blue pixel (B). In the array substrate shown in FIG. 2, the array is subdivided so that the ratio of the number of rows of pixels (M) to the number of columns (N) is 2 to 1. In that case, each column of pixels may be provided with two (2) gate connecting lines 12. As shown in FIG. 2, a first gate connecting line 12 is provided on one side of each column of red (R) pixels, and a second gate connecting line 12 is provided between each column of green (G) pixels and each column of blue (B) pixels. The gate connecting lines 12 are electrically connected to the gate lines 15 via the through-holes 16. There are no particular limitations on the configuration and arrangement of the gate connecting lines 12, and the gate connecting lines 12 may be arranged in any suitable manner known to a person of ordinary skill in the art, for example, depending on the intended purpose of the display panel.

In some embodiments (for example, as shown in FIG. 1), the display panel is rectangular. The first area 1 and the second area 2 form a right angle of the rectangle, and the length of the first area 1 is shorter than the length of the second area 2. Similarly, the third area 3 and the fourth area 4 form another right angle of the rectangle, and the length of the third area 3 is shorter than the length of the fourth area 4. The first and third areas 1, 3 are on opposite sides of the rectangle from each other. Each row of pixels is arranged in a direction parallel to the first area 1 (and the third area 3).

Figure 5:
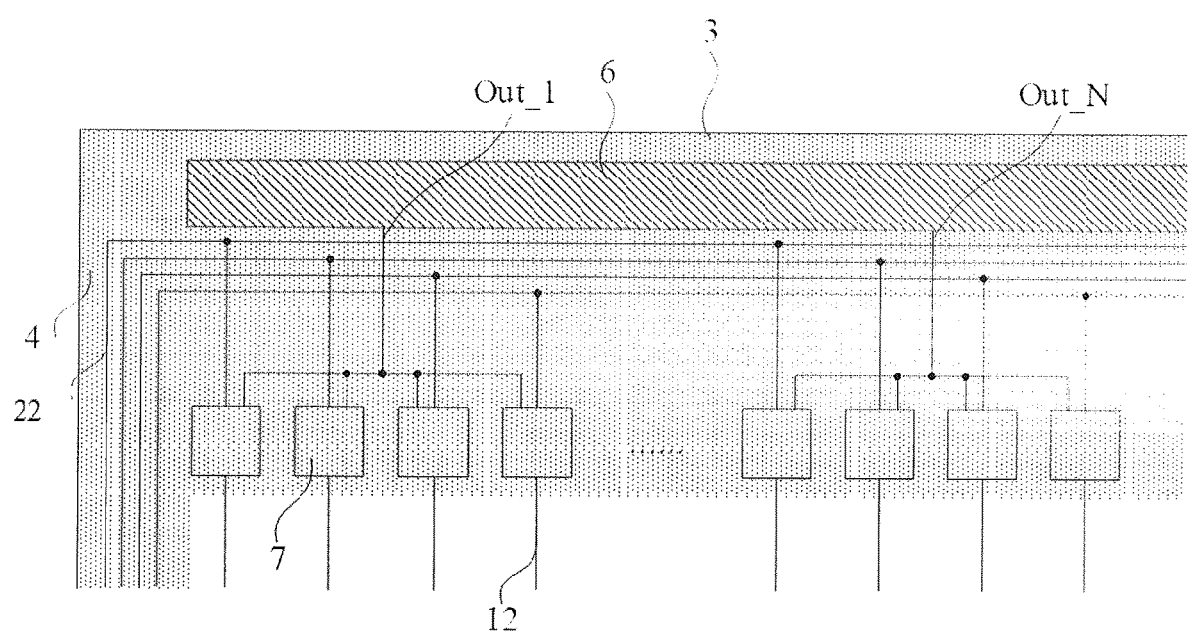
FIG. 5 shows a blown-up diagram of the dashed-line portion of the wiring diagram illustrated in FIG. 2.

The gate drive circuit 6 includes a plurality of output terminals (Out_1 and Out_N in FIG. 5). For the purpose of illustration, the gate drive circuit 6 includes N output terminals electrically connected to S gate connecting lines 12. N and S are each a positive integer greater than 1.

In the embodiment of the display panel illustrated in FIG. 1, the gate drive circuit 6 is provided on the third area 3, that is, on an area of the display panel having the shorter length, and each row of pixels is arranged in a direction parallel to the shorter third area 3. This results in the number of output terminals on the gate drive circuit 6 generally being smaller than the number (M) of signal transmission lines 22, because the length of the portion of the display panel on which the gate drive circuit 6 is provided affects the number of output terminals that can be installed. By electrically connecting each output terminal to S gate connecting lines 12, the present disclosure makes it possible to ensure that each signal transmission line 22 receives the gate driving signals from the gate drive circuit 6, so as to greatly improve the driving of each pixel's transistors.

In some embodiments, the display panel may further include a plurality of switches. A switch may be implemented with a plurality of transistors. For example, the display panel may include S×N switches. Each switch comprises a first end, a second end, and a third end. The first end of a switch is electrically connected to a signal transmission line 22, which is in turn connected to an output terminal of the gate drive circuit. This output terminal is electrically connected to the second end of the switch 7.

The display panel may further include a timing control unit. The timing control unit is configured to be electrically connected to the third end of a switch 7, and to generate time sequence signals for controlling the turning on and off of each output terminal and each of the S gate connecting line 12 that is connected to the output terminal.

FIG. 5 shows a blown-up diagram of the dashed-line portion of the wiring diagram illustrated in FIG. 2, illustrating a connection between an output terminal (Out_1, Out_N) and a gate connecting line 12 according to an embodiment of the present disclosure. As shown in FIG. 5, X (number of signal transmission lines 22 connected to an output terminal) is 4, and there are N output terminals (OUT_1, OUT_2 . . . OUT_N). As an illustrative example, OUT_1 is electrically connected to four (4) switches 7, each of the four switches 7 being electrically connected to a timing control unit 8. The timing control unit 8 transmits a time sequence signal, via a signal transmission line 22, to each switch 7, in order to turn ON or OFF the switch 7. When the switch 7 is turned ON, OUT_1 is configured to transmit gate drive signals along the gate connecting lines 12. Each output terminal is thus configured to sequentially transmit gate drive signals along S gate connecting lines 12, and to control sequential driving of the pixels.

In some embodiments, the display panel may further include a reset unit. When the $(n+1)^{th}$ switch 7 is turned on, the reset unit is configured to reset the signal transmission line 22 electrically connected to the $n^{th}$ switch 7. When the first transistor in a switch 7 is turned ON, the reset unit is configured to reset the signal transmission line 22 electrically connected to the $(S \times N)^{th}$ switch. The value of n may be smaller than a positive integer of (S×N).

Figure 6:
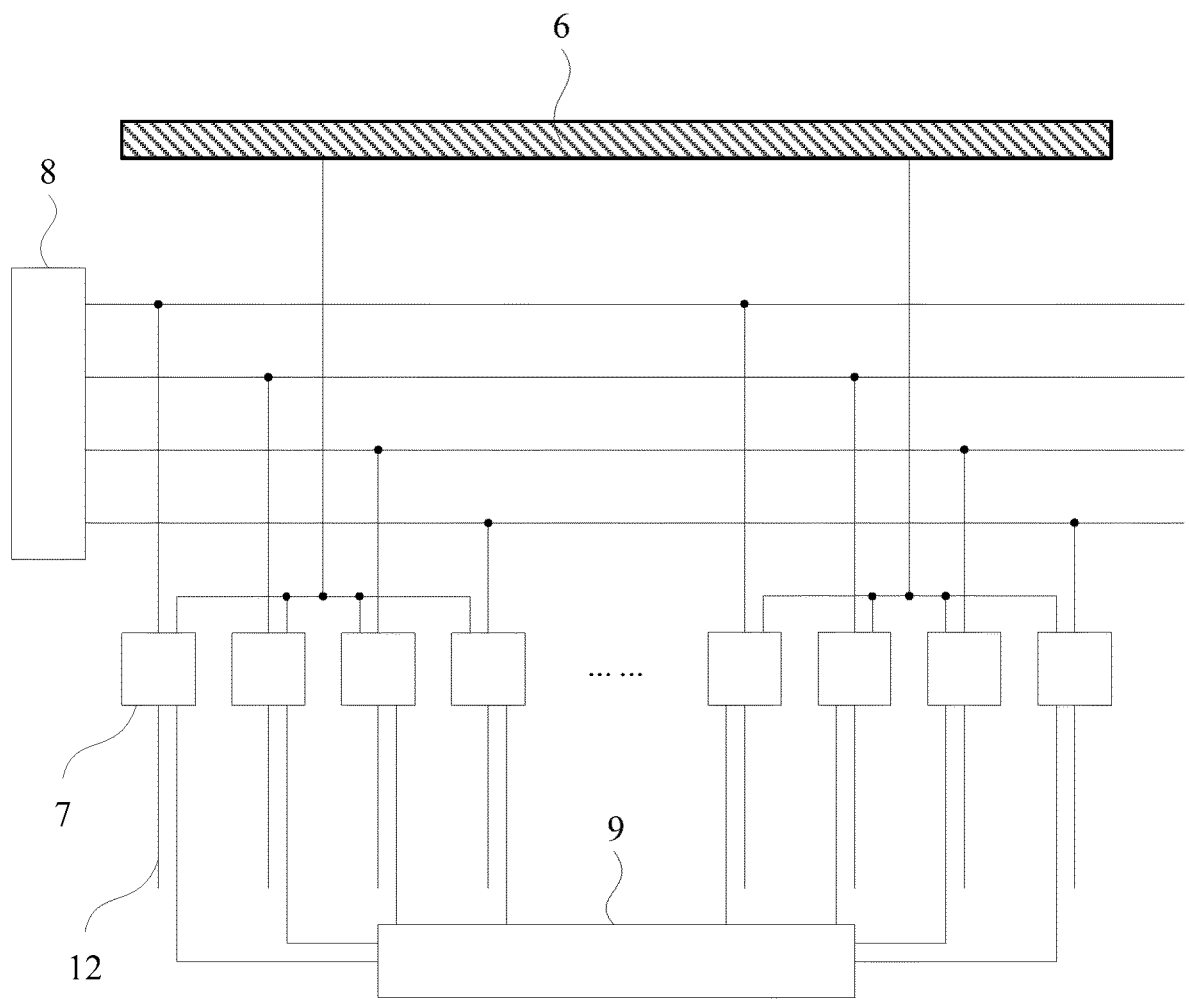
FIGS. 6 and 7 show schematic diagrams illustrating a connection between an output terminal and a signal transmission line according to embodiments of the present disclosure.
Figure 7:
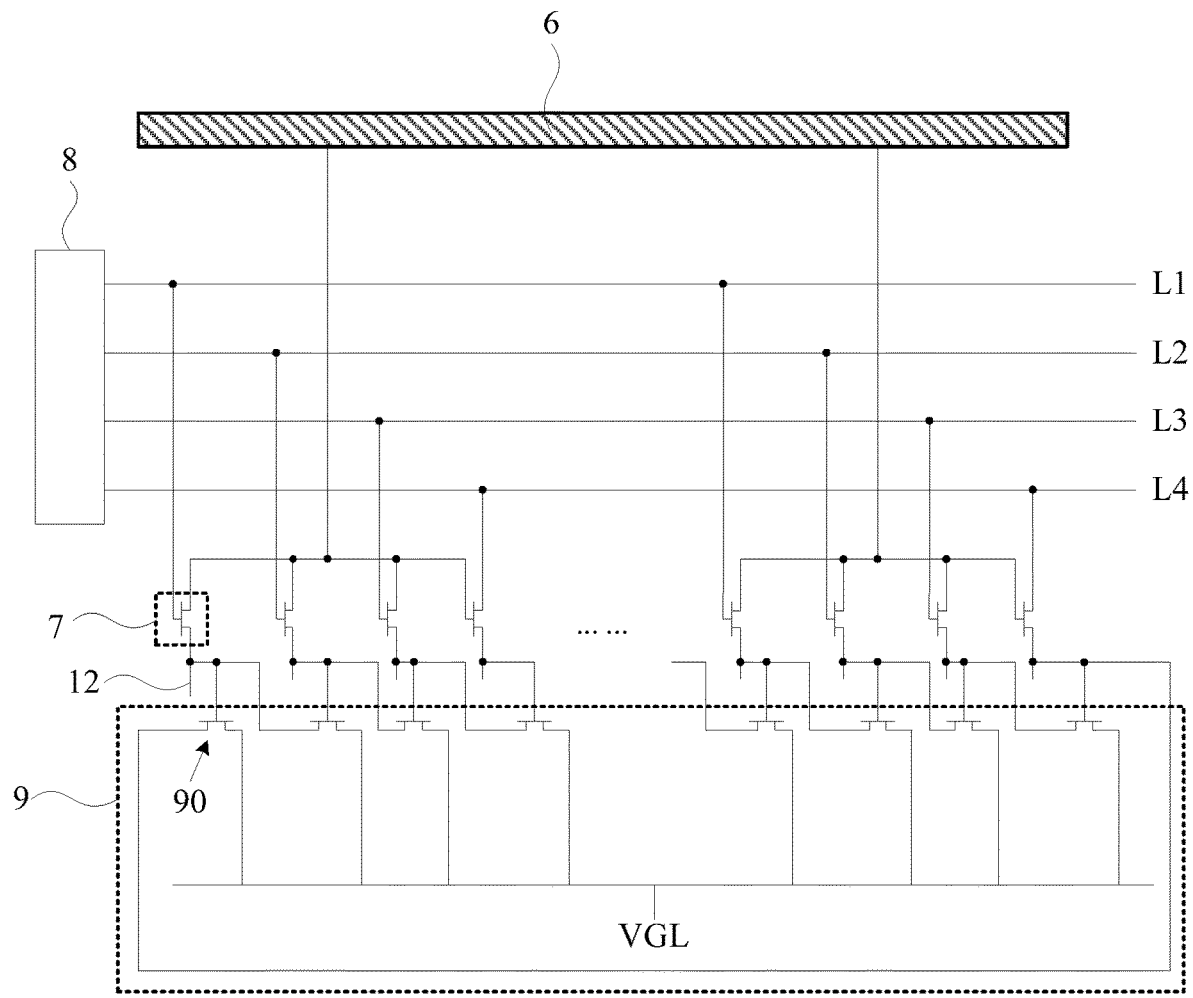

FIG. 6 shows a schematic diagram illustrating a connection between an output terminal and a gate connecting line 12 according to another embodiment of the present disclosure. As shown in FIG. 6, the gate drive circuit 6 may be provided in an area of the peripheral area PA of the display panel opposite from the reset unit 9 (for example, in FIG. 6, the gate drive circuit 6 may be provided in third area 3 of the peripheral area PA, and the reset unit 9 may be provided in the first area 1 of the peripheral area PA). As shown in FIG. 7, a reset unit 9 is electrically connected to each switch 7. As an example, when the second switch is turned ON, the reset unit 9 is configured to reset the signal transmission line 22 electrically connected to the first switch. More generally, during scanning of the rows of pixels, when a particular row of pixels is turned ON, the previous row of pixels is turned OFF, and when the first row of pixels in a new frame is being scanned, the last row of pixels in the previous frame is turned OFF. This configuration of the display panel enables the sequential scanning of the rows of pixels.

The reset unit 9 may include a plurality of transistors. Each transistor comprises a gate electrode, a source electrode, and a drain electrode. In some embodiments, the reset unit 9 includes the same number of transistors as the number of switches in the gate drive circuit 6. More particularly, the reset unit 9 may include S×N transistors. The gate electrode of the $n^{th}$ transistor is electrically connected to the first end of the $n^{th}$ switch. The source electrode of the $n^{th}$ transistor is electrically connected to a predetermined voltage signal (for example, a low voltage signal (VGL)). The drain electrode of the $n^{th}$ transistor is electrically connected to the first end of the $(n+1)^{th}$ switch. In addition, the drain electrode of the first of the plurality of transistors 90 is electrically connected to the first end of the $(S \times N)^{th}$ transistor.

FIG. 7 shows a schematic diagram illustrating a connection between an output terminal and a gate connecting line 12 according to an embodiment of the present disclosure. As shown in FIG. 7, the switch 7 is composed of as plurality of transistors, and the reset unit 9 includes S×N transistors 90. The gate electrode of the $n^{th}$ transistor is electrically connected to the first end of the $n^{th}$ switch (for example, a drain electrode). The source electrode of the $n^{th}$ transistor is electrically connected to a predetermined voltage signal (for example, a low voltage signal (VGL)). The drain electrode of the $n^{th}$ transistor is electrically connected to the first end of the $(n+1)^{th}$ switch. More particularly, the drain electrode of the first transistor is electrically connected to the first end of the $(S \times N)^{th}$ switch. As shown in FIG. 7, the gate drive circuit 6 may be provided in an area of the peripheral area PA of the display panel opposite from the reset unit 9 comprising the transistors 90 (for example, in FIG. 7, the gate drive circuit 6 may be provided in third area 3 of the peripheral area PA, and the reset unit 9 may be provided in the first area 1 of the peripheral area PA).

Figure 8:
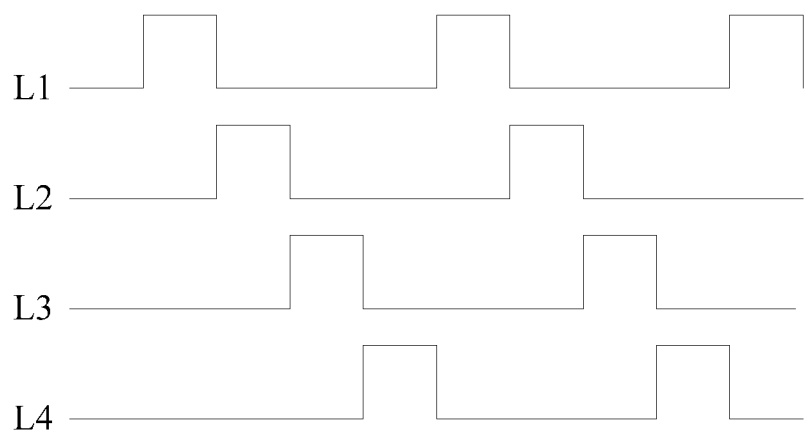
FIG. 8 shows a waveform diagram illustrating a time sequence signal according to an embodiment of the present disclosure.

FIG. 8 shows a waveform diagram illustrating a time sequence signal according to an embodiment of the present disclosure. As shown in FIG. 8, a first timing control line L1 is connected to the first switch in a set of four (4) switches. A second timing control line L2 is connected to the second switch in a set of four (4) switches. A third timing control line L3 is connected to the third switch in a set of four (4) switches. A fourth timing control line L4 is connected to the fourth switch in a set of four (4) switches. High-voltage signals are transmitted to each of the four timing control lines L1, L2, L3, L4, and the timing of the high-voltage signals transmitted to different timing control lines does not overlap. Each high-voltage signal on each timing control line occupies ¼ of a cycle.

As shown in FIGS. 7 and 8, when the (n+1)th switch is turned ON, the (n+1)th transistor is also turned ON, and low-voltage signal is transmitted to the first end of the nth switch, so that the signal transmission line 22 corresponding to the nth switch becomes low voltage. When the first transistor of the switch is turned ON, the first transistor of the reset unit is turned ON, low-voltage signal is transmitted to the first end of the $(S \times N)^{th}$ switch, so that the signal transmission line corresponding to the $(S \times N)^{th}$ switch becomes low voltage.

During scanning of the rows of pixels, a display panel according to the present disclosure is configured to turn ON a row of pixels and turn OFF the previous row of pixels, and turn ON the first row of pixels in a new frame and turn OFF the last row of pixels in the previous frame. This configuration of the display panel enables the sequential scanning of the rows of pixels.

In some embodiments, the display panel may include a touch metal line, a red pixel data line, a green pixel data line, and/or a blue pixel data line. The signal transmission lines are provided on a portion of the substrate that directly corresponds to the touch metal line, the red pixel data line, the green pixel data line, and/or the blue pixel data line.

The touch metal line, the red pixel data line, the green pixel data line, and the blue pixel data line may shield light emitted by the display panel. Arranging the signal transmission lines on a portion of the substrate that directly corresponds to the touch metal line, the red pixel data line, the green pixel data line, and/or the blue pixel data line prevents the touch metal line, the red pixel data line, the green pixel data line, and/or the blue pixel data from causing excessive light shielding and reducing the transparency of the display panel.

The present disclosure also provides a display device. The display device may be any device known to a person of ordinary skill in the art, including, but not limited to, a mobile phone, a tablet, a television, a computer, a display, a notebook computer, a digital photo frame, a navigation system, and any other products or components that provide a display function.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

What is claimed is:

1. A display panel, comprising:
   a display area; and
   a peripheral area surrounding the display area, the peripheral area comprising a first area, a second area, a third area opposite to the first area, and a fourth area opposite to the second area,
   wherein the display panel further comprises:
   a data driving integrated circuit provided in the first area;
   a gate drive circuit provided in the third area; and
   a plurality of signal transmission lines arranged in at least one of the second area and the fourth area,
   wherein the plurality of signal transmission lines extend in a first direction, and are electrically connected to the gate drive circuit and configured to provide time sequence signals to the gate drive circuit, and
   wherein the display panel further comprises a plurality of switches, the number of switches satisfying the relationship N×S, with N being a number of output terminals in the gate drive circuit, S being a number of gate connecting lines connected to one of the plurality of output terminals, and N and S each being a positive integer equal to or greater than 1.

2. The display panel according to claim 1, further comprising:
   a plurality of gate connecting lines arranged in the display area and extending in the first direction; and
   a plurality of gate lines arranged in the display area and extending in a second direction,
   wherein the first direction and the second direction are substantially perpendicular to each other.

3. The display panel according to claim 1, further comprising:
   a substrate;
   a light shielding layer provided on one side of the substrate;
   a buffer layer provided on a side of the light shielding layer opposite from the substrate;
   a gate insulating layer provided on a side of the buffer layer opposite from the substrate; and
   at least one through-hole extending through the buffer layer and the gate insulating layer,
   wherein the plurality of signal transmission lines are provided in a same layer as the light shielding layer,
   wherein a plurality of gate lines are provided on a side of the gate insulating layer opposite from the substrate, and
   wherein the plurality of gate lines are electrically connected to the plurality of signal transmission lines through the at least one through-hole.

4. The display panel according to claim 1, wherein the gate drive circuit comprises a plurality of output terminals, each output terminal being connected to at least a portion of the plurality of gate connecting lines.

5. The display panel according to claim 1,
   wherein each of the plurality of switches comprises a first end and a second end,
   wherein the first end of each of the plurality of switches is electrically connected to at least one of the plurality of gate connecting lines, and
   wherein the second end of each of the plurality of switches is electrically connected to an output terminal of the gate drive circuit that is connected to the at least one of the plurality of gate connecting lines.

6. The display panel according to claim 1,
   wherein the display panel comprises an array of pixels,
   wherein the display panel comprises a same number of gate connecting lines as a number of rows in the array of pixels, and
   wherein each of the gate connecting lines is electrically connected to one of the rows in the array of pixels.

7. The display panel according to claim 1,
   wherein each of the plurality of switches comprises a plurality of transistors, and
   wherein the display panel further comprises a reset unit configured to perform a reset operation to at least one of (i) a gate connecting line connected to a (n+1)-th switch when a n-th switch is turned on and (ii) a gate connecting line connected to a (N×S)-th switch when a first of the plurality of transistors in a switch is turned on, with n being a value that is smaller than a positive integer of (N×S).

8. The display panel according to claim 7, wherein the reset unit comprises a plurality of transistors, the number of transistors in the reset unit being the same as the number of switches in the display panel.

9. The display panel according to claim 8,
wherein each of the plurality of transistors of the reset unit comprises a gate electrode, a source electrode, and a drain electrode,
wherein the gate electrode of an n-th transistor in the reset unit is electrically connected to a first end of the corresponding n-th switch,
wherein the source electrode of the n-th transistor in the reset unit is electrically connected to a predetermined voltage signal, and
wherein the drain electrode of the n-th transistor is electrically connected to a first end of the (n+1)-th switch.

10. The display panel according to claim 9, wherein the drain electrode of the first transistor in the reset unit is electrically connected to a first end of the (N×S)-th transistor.

11. A display device, comprising the display panel according to claim 1.

* * * * *